(12) United States Patent
Chieng et al.

(10) Patent No.: US 7,474,722 B1
(45) Date of Patent: Jan. 6, 2009

(54) SYSTEMS AND METHODS FOR SAMPLE RATE CONVERSION USING MULTIPLE RATE ESTIMATE COUNTERS

(75) Inventors: Daniel L. W. Chieng, Austin, TX (US); Jack B. Andersen, Austin, TX (US); Larry E. Hand, Meridian, MS (US)

(73) Assignee: D2Audio Corporation, Austin, TX (US)

( * ) Notice: Subject to any disclaimer, the term of this patent is extended or adjusted under 35 U.S.C. 154(b) by 810 days.

(21) Appl. No.: 10/805,591

(22) Filed: Mar. 19, 2004

Related U.S. Application Data

(60) Provisional application No. 60/469,725, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H04L 7/00* (2006.01)
(52) U.S. Cl. ...................................... 375/355
(58) Field of Classification Search .............. 375/238, 375/316, 354, 355, 359, 377; 329/311, 312; 327/100, 141, 144, 172, 171, 175, 176
See application file for complete search history.

(56) References Cited

U.S. PATENT DOCUMENTS

| 4,641,326 A | * | 2/1987 | Tomisawa | 375/357 |
| 5,285,263 A | * | 2/1994 | Fujita | 348/441 |
| 5,367,162 A | * | 11/1994 | Holland et al. | 250/287 |
| 5,475,628 A | * | 12/1995 | Adams et al. | 708/313 |
| 5,621,805 A | * | 4/1997 | Loh et al. | 381/119 |
| 6,044,113 A | * | 3/2000 | Oltean | 375/238 |
| 6,324,235 B1 | * | 11/2001 | Savell et al. | 375/372 |
| 6,393,198 B1 | * | 5/2002 | LaMacchia | 386/54 |

(Continued)

OTHER PUBLICATIONS

Ketola, "Synchronization of fractional interval counter in non-integer ratio sample rate converters", Proceedings of the 2003 International Symposium on Circuits and Systems, 2003, ISCAS '03, vol. 2, May 25-28, 2003 pp. II-89-II-92 vol. 2.*

*Primary Examiner*—Juan A Torres
(74) *Attorney, Agent, or Firm*—Law Offices of Mark L. Berrier

(57) ABSTRACT

Systems and methods for using multiple rate estimate counters in converting input data streams having variable sample rates to an output sample rate that are used in processing the data streams. In one embodiment, a system includes a clock source, first and second counters coupled to the clock source and configured to count cycles for corresponding data streams, and a data processor coupled to the first and second counters. The data processor is configured to read the number of cycles counted by each of the counters between received frame sync signals and to convert the first data stream to the predetermined output sample rate based on the corresponding number of cycles counted, and to convert the second data stream to the predetermined output sample rate based on the ratio of the numbers of cycles counted in the first and second counters.

18 Claims, 5 Drawing Sheets

U.S. PATENT DOCUMENTS

| | | | |
|---|---|---|---|
| 6,665,338 B1 * | 12/2003 | Midya et al. | 375/238 |
| 6,765,931 B1 * | 7/2004 | Rabenko et al. | 370/493 |
| 6,819,732 B1 * | 11/2004 | Savell | 375/377 |
| 7,167,112 B2 * | 1/2007 | Andersen et al. | 341/61 |
| 7,236,109 B1 * | 6/2007 | Duewer et al. | 341/61 |
| 7,262,716 B2 * | 8/2007 | Yu et al. | 341/61 |
| 2001/0033583 A1 * | 10/2001 | Rabenko et al. | 370/503 |
| 2002/0190880 A1 * | 12/2002 | McLaughlin et al. | 341/61 |
| 2003/0037297 A1 * | 2/2003 | Araki | 714/746 |

* cited by examiner

SYSTEMS AND METHODS FOR SAMPLE RATE CONVERSION USING MULTIPLE RATE ESTIMATE COUNTERS

RELATED APPLICATIONS

This application claims priority to U.S. Provisional Patent Application No. 60/469,725, entitled "SRC with Dual Input Rate Estimator Counters for Automatic Second Sample Rate Detection," by Chieng, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

1. Field of the Invention

The invention relates generally to audio amplification systems, and more particularly to systems and methods for converting multiple data streams at an input sample rate to one or more output sample rates using dual rate estimate counters.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

One of the problems with conventional digital audio amplifiers relates to the fact that there are many different sources of audio data that may need to be amplified. For instance, the audio data sources may be CD players, MP3 players, digital audio tape players, or other types of data sources. The problem is that these devices may provide digital audio data at different sample rates. A CD player, for example, may output digital audio data at a sample rate of 44.1 kHz, while a digital audio tape player may output data at a sample rate of 32 kHz.

Conventional digital audio amplifiers do not have a particularly efficient mechanism for dealing with the different sample rates that may be encountered. For instance, a conventional system typically has to provide two entirely separate sample rate converters in order to handle two different data sources that have different sample rates. Further, each of these sample rate converters has to be configured to handle a particular predetermined sample rate. If the audio data that is received does not have the predetermined sample rate, the sample rate converter cannot properly convert the input audio data to the sample rate that is used within the processing system of the amplifier. These mechanisms for handling different input sample rates are therefore relatively costly and inflexible.

SUMMARY OF THE INVENTION

One or more of the problems outlined above may be solved by the various embodiments of the invention. Broadly speaking, the invention comprises systems and methods for converting input data streams having variable sample rates to an output sample rate that are used in processing the data streams.

One embodiment of the invention comprises a system having a clock source, first and second counters coupled to the clock source and configured to count cycles between frame sync signals in first and second digital data streams, respectively, and a data processor coupled to the first and second counters. The data processor is configured to read the number of cycles counted by each of the first and second counters between corresponding frame sync signals and to convert the first digital data stream from a corresponding input sample rate to a predetermined output sample rate based on the number of cycles counted in the corresponding digital data stream. In one embodiment, the data processor converts the second digital data stream from a corresponding input sample rate to the predetermined output sample rate based on the ratio of the numbers of cycles counted by the first and second counters.

In one embodiment, the counters are configured to count cycles by incrementing each time a cycle is detected. In one embodiment, the output of the rate estimators (which is based on the numbers of cycles counted by the counters) may be low-pass filtered to reduce variations in the estimated input sample rates. In one embodiment, the system is implemented in a single sample rate converter in a digital PWM amplifier. In one embodiment, the system includes a FIFO corresponding to each data source for storing audio data until the data can be converted from the corresponding input sample rate to the output sample rate.

An alternative embodiment of the invention comprises a method which includes the steps of receiving a clock signal and first and second digital data streams, counting the numbers of samples in the first and second digital data streams, and converting the first digital data stream from a corresponding input sample rate to a predetermined output sample rate based on the number of samples counted in this data stream. The method may also include converting the second digital data stream from a corresponding input sample rate to a predetermined output sample rate based on the ratio of samples counted in the first data stream to the number of samples counted in the second data stream.

In one embodiment, the method is implemented in a single sample rate converter of a digital PWM audio amplifier. In one embodiment, the cycles are counted by incrementing counters each time a cycle is detected. In one embodiment, the output of the rate estimators based on the numbers of cycles counted for each data stream may be low-pass filtered. In one embodiment, the data from each data source is stored in a FIFO until a corresponding sample rate is estimated and the data can be converted from the estimated input sample rate to the output sample rate.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
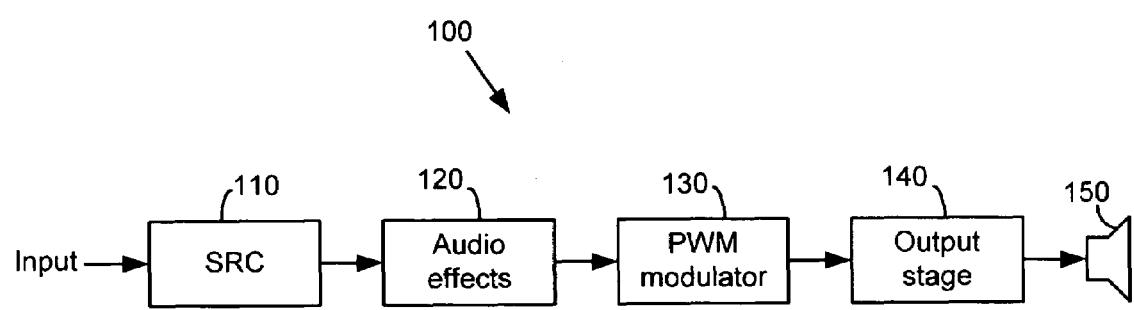
FIG. 1 is a functional block diagram illustrating a digital audio amplification system using PWM technology.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for converting multiple data streams at two or more corresponding input sample rates to an output sample rate using dual rate estimate counters.

As noted above, audio amplifier systems may receive input audio data from multiple sources. These sources may have various sample rates. For example, the digital audio output from a CD player may have a sample rate of 44.1 kHz, while the output from a digital audio tape player may have a sample rate of 32 kHz. In some instances, the different audio data streams may comprise multi-channel audio. In this instance, one data stream has what is considered a "primary" sample rate, while the other data stream has what is considered a "sub-sample" rate. The "sub-sample" rate is typically an integer multiple of the primary sample rate. For example, the DVD-Audio specification permits some channels to be sampled at twice the primary sample rate. There are also instances in which the sample rates of the different audio data streams are not multiples of each other, or are not at the predetermined rates.

The present systems and methods, rather than using two separate sample rate converters that can only accept certain input sample rates, use a single sample rate converter with multiple rate estimator counters. Including one or more additional rate estimator counters adds minimal logic to the system, but increases the capabilities as described below. In one embodiment, both rate estimator counters are clocked by the same high speed system clock. The output of each counter is stored in a register accessible by the digital signal processor (DSP) of the sample rate converter. During normal operation, one of the rate estimator counters will capture the primary sample rate, and its output will be used for rate estimation. In this embodiment, it is assumed that the secondary sample rate is a multiple of the primary sample rate. The second rate estimator counter is therefore read by the DSP, and the value is compared to the first rate estimator counter value to determine the relative integer multiple value. The sample rate converter then adapts automatically and adjusts the conversion ratio accordingly. This methodology removes the need for input sample rate messaging or external configuration.

Data at each sample rate will be stored separately in the input FIFO and the DSP processes each block of data according to the corresponding sample rate. This concept may apply to a multi-sample rate converter configuration as well. The master sample rate converter performs the rate estimation, while slaves detect the sub-sample rates. This concept may also be applied to having any number of rate estimate counters for multiple rate detection, only limited by the bandwidth of the DSP.

One approach is to add a second rate estimator (RE) counter that has a minimal amount of logic, adding insignificant cost to the system. Both rate estimate counters are clocked by the same high speed system clock. The output of the counter is stored in a register accessible by the digital signal processor (DSP) of the sample rate converter. During normal operation, one of the rate estimate counters will capture the primary sample rate, and its output will be used for rate estimation. The second rate estimate counter is read by the DSP, and the value is compared to the first rate estimate counter value to determine the relative integer multiple value. The sample rate converter then adapts automatically and adjusts the conversion ratio accordingly. This methodology removes the need for input sample rate messaging or external configuration.

In one embodiment, data at each sample rate is stored separately in the input FIFO and the DSP processes each block of data according to the corresponding sample rate. This concept may apply to a multi-sample rate converter configuration as well. The master sample rate converter performs the rate estimation, while slaves detect the sub-sample rates. This concept may also be applied to having any number of rate estimate counters for multiple rate detection, only limited by the bandwidth of the DSP.

A preferred embodiment of the invention is implemented in an audio amplification system. As noted above, pulse width modulation (PWM) technology has recently been applied in audio amplification systems, but has suffered from the drawbacks of conventional methodologies. These methodologies employ analog modulation schemes which are very complex and costly, and which provide relatively poor performance. The present systems and methods are instead implemented in digital modulation schemes and employ methodologies which overcome some of the problems that existed in the prior art.

Referring to FIG. 1, a functional block diagram illustrating a digital audio amplification system using PWM technology is shown. In this embodiment, system 100 receives a digital input data stream from a data source such as a CD player, MP3 player, digital audio tape, or the like. The input data stream is received by sample rate converter 110. The input data stream has a particular sample rate which depends upon the data source. This sample rate is typically one of a set of predetermined sample rates that are used by the corresponding type of device. For example, a CD player may output digital data with a sample rate of 44.1 kHz, while a digital audio tape player may output data with a sample rate of 32 kHz.

In the present systems and methods, sample rate converter 110 converts the input data stream from the sample rate at which it was received to a predetermined internal rate which is used within system 100. In one embodiment, this internal sample rate is 100 kHz. Thus, if data is received at a sample rate of 50 kHz, sample rate converter 110 will re-sample the data to produce a corresponding internal data stream at a sample rate of 100 kHz. This internal data stream is then provided to an audio effects subsystem 120. Audio effects subsystem 120 performs any desired processing on the internal data stream and provides the resulting processed data stream to PWM modulator 130.

The data stream received by PWM modulator 130 represents a pulse code modulated signal. PWM modulator 130 converts this data stream to a pulse width modulated signal. The pulse width modulated signal is then provided to output stage 140. In output stage 140 amplifies the pulse width modulated signal and may perform some filtering or further processing of the amplified signal. The resulting signal is then output to a speaker system 150, which converts the electrical signal to an audible signal which can be heard by a listener.

The present disclosure focuses on the sample rate converter in the audio system described above. As explained above, the purpose of the sample rate converter is to receive an input data stream which is sampled at a first rate, and to generate an output data stream which is sampled at a second rate. While the audio signal which is represented by the data stream remains essentially unchanged (at least in some embodiments), the sampling rate is changed to conform to the requirements of the audio system so that it can be processed by the system.

Figure 2:
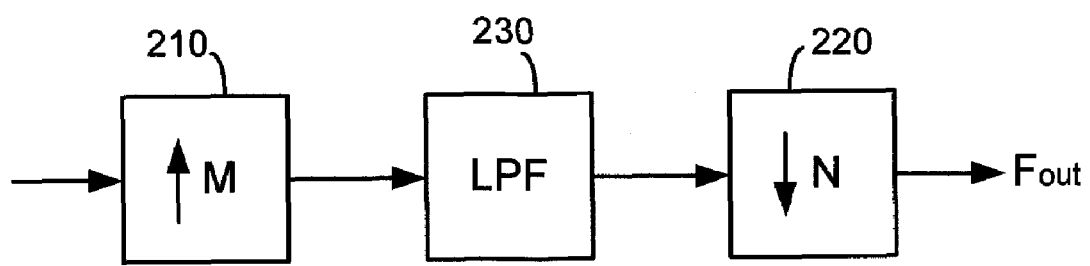
FIG. 2 is a diagram illustrating the manner in which sample rate conversion is typically performed.

Referring to FIG. 2, a diagram illustrating the manner in which sample rate conversion is typically performed is shown. As depicted by this figure, an input data stream is first up-sampled, or interpolated, by a first filter 210, and is down-sampled, or decimated, by a second filter 220. An intermediate filter 230 is used to low-pass filter the up-sampled data before it is decimated. The input data stream has a first sample rate, Fin. This data stream is up-sampled by a factor of M. Thus, after up-sampling, the data stream has a sample rate of M×Fin. The up-sampling is typically achieved by interpolating between the samples of the input data stream to generate intermediate samples. M is chosen so that the intermediate sample rate (M×Fin) is higher than the desired output sample rate, Fout. Typically, the intermediate rate is much higher than the desired output rate.

The up-sampled data stream is low-pass filtered and then decimated to reduce the sample rate from the intermediate rate to the desired output rate. After down-sampling, the sample rate is Fout=(M/N)×Fin. The down-sampling, or decimation, of the data stream is typically accomplished by dropping samples from the intermediate data stream. For example, if the intermediate data stream is sampled at 200 kHz and the desired output sample rate is 100 kHz, every other sample will be dropped.

Ideally, M and N are integers. If M is an integer, the up-sampling of the input data stream comprises inserting M−1 new samples, evenly spaced between each of the original samples. Then, if N is an integer, the down-sampling of the intermediate data stream comprises taking only every Nth sample and dropping the rest. This is illustrated in FIG. 3.

Figure 3:
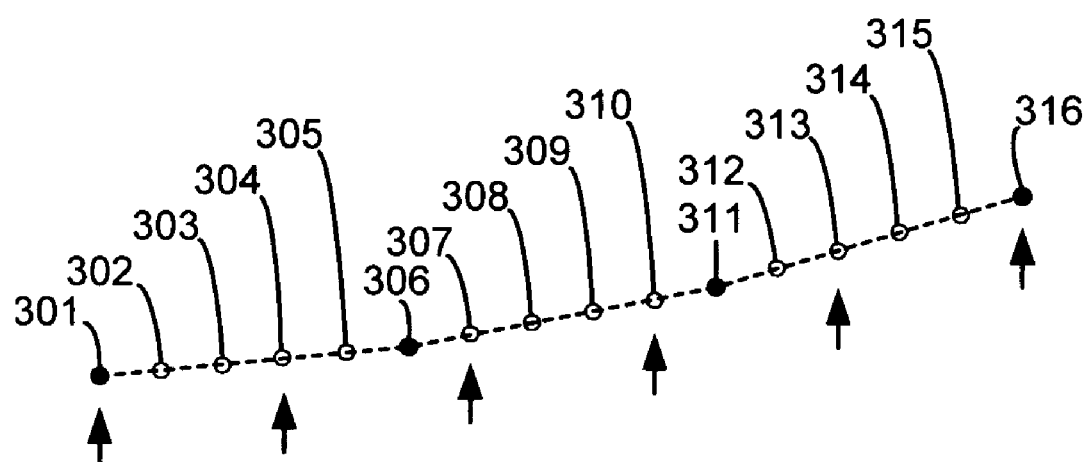
FIG. 3 is a diagram illustrating the interpolation and decimation of a sampled input signal to produce a corresponding signal at a different sample rate.

FIG. 3 is a diagram illustrating the interpolation and decimation of a sampled input signal to produce a corresponding signal at a different sample rate. In this figure, the input samples are represented by points 301, 306, 311 and 316. The straight-line interpolated value of the signal is represented by the dotted lines. The signal is up-sampled by a factor of 5, so 4 additional sample points are interpolated between each pair of adjacent samples. Thus, points 302-305 are inserted in the interval between sample 301 and sample 306. Likewise, points 307-310 are inserted between samples 306 and 311, and points 312-315 are inserted between samples 311 and 316. After being low-pass filtered, the resulting points (301-316) are down-sampled by a factor of 3, so every third point is used, and the remainder are discarded. The resulting data stream consists of samples 301, 304, 307, 310, 313 and 316 (as indicated by the arrows).

One of the problems with a straightforward implementation of the up-sampling and down-sampling of the input data stream is that, in order to make M and N integers, and in order to maintain the desired resolution, M and N typically must be very large numbers. Consider the example of FIG. 3. If $F_{in}$ is 60 kHz and $F_{out}$ is 100 kHz, M is 5 and N is 3. If $F_{in}$ were 60.5 kHz instead of 60 kHz, however it would be necessary to select M=200 and N=121. Scenarios requiring even higher values for M and N can easily be developed. Based upon the resolution of the sample rate converter in the preferred embodiment, values of up to $2^{18}$ might be necessary.

Another problem with the interpolation-and-decimation methodology is that it may be difficult to handle variations in the sample rates of the received data streams. In typical audio systems, each device or component may generate its own clock signal upon which the corresponding sample rate is based. Even if the clock signals for two components are intended to be identical, however, the clock signals are not synchronized and may have slight variations. As a result of the differences in clock signals, data may be dropped, or buffers may overflow, resulting in errors. The present sample rate converter is designed to handle these differences.

It should be noted that audio systems may also include various different types of audio sources. For example, the audio signal may be generated by a CD player, MP3 player, digital audio tape or the like. These devices may be configured to generate audio signals at different sample rates. For instance, a CD player may provide an output signal that has a 44.1 kHz sample rate, while a digital audio tape player may generate an output signal at a 32 kHz sample rate. The present systems and methods enable the sample rate converter to accommodate multiple different sample rates in the input data stream. Moreover, the sample rate converter is capable of independently adjusting each channel to accommodate a different input sample rate. By comparison, prior art systems can only accommodate different sample rates on different channels if the two sample rates are known.

The accommodation of different sample rates, and variations between rates that are nominally the same, may be achieved in part through the use of a polyphase filter. The polyphase filter performs the functions of both interpolator 210 and decimator 220. The polyphase filter performs these functions by interpolating the input data stream in a manner which does not require that the data stream be up-sampled by an integer factor or down-sampled by an integer factor.

The interpolator and the decimator described above are typically implemented as (FIR-type) filters. The polyphase filter is obviously also a filter, but rather than generating a large number of samples (as performed by the interpolation filter) and then throwing away unneeded samples and (as performed by the decimation filter), the polyphase filter generates only those samples that will, in the end, be retained. Thus, compared to the example of FIG. 3, rather than generating samples 301-316 and then discarding two-thirds of these samples, only samples 301, 304, 307, 310, 313 and 316 are generated, and none are discarded.

The polyphase filter is defined by a set of filter coefficients. If the coefficients are extrapolated to a different set of coefficients, different sampling rates are achieved. This enables non-integer sample rate conversion through the choice of appropriate filter coefficients.

Figure 4:
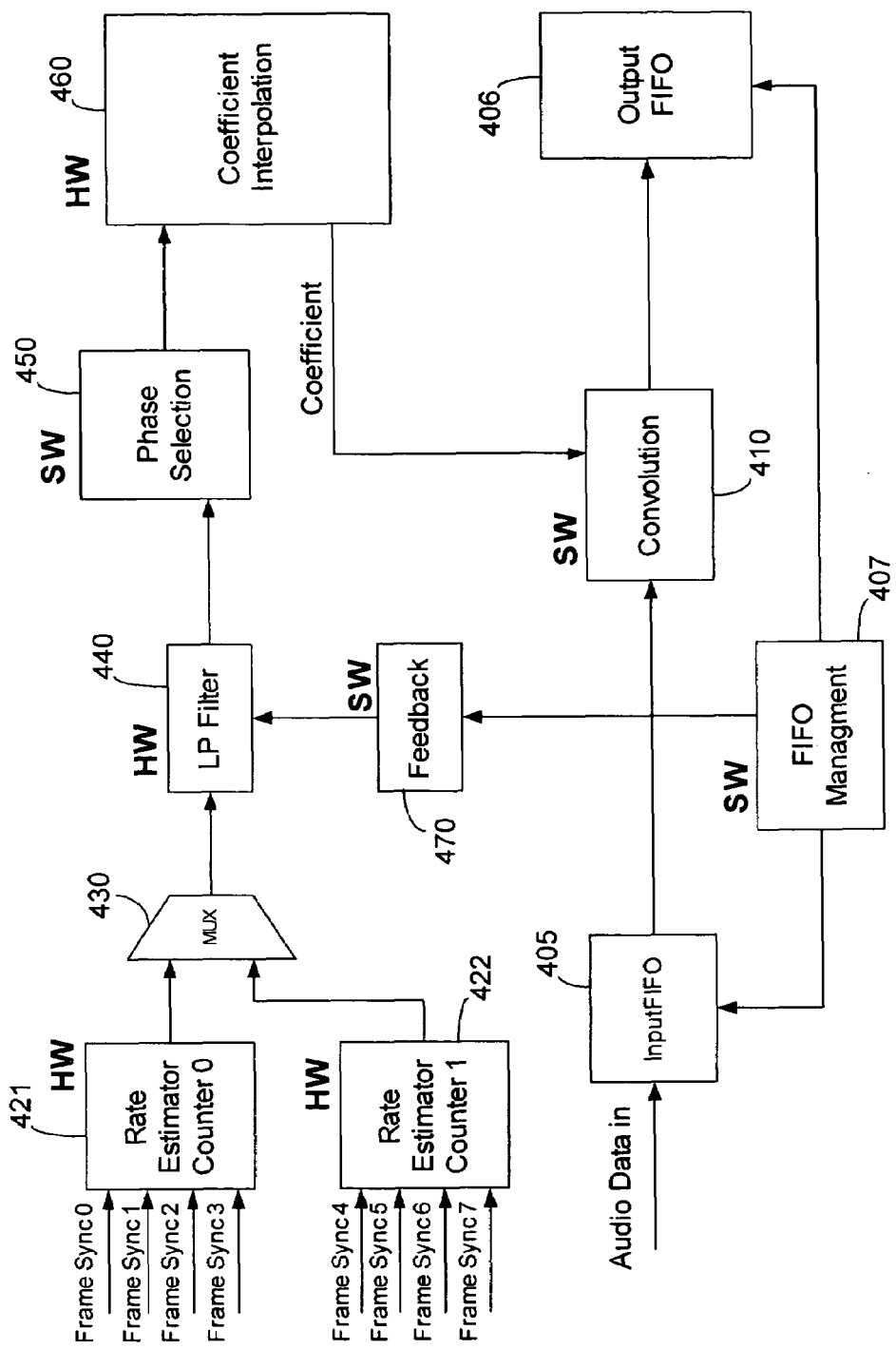
FIG. 4 is a diagram illustrating the components of a sample rate converter in accordance with one embodiment of the invention.

Referring to FIG. 4, a diagram illustrating the components of a sample rate converter in accordance with one embodiment of the invention is shown. The lower half of the figure generally corresponds to a data path for the audio data that will be converted, while the upper half of the figure corresponds to a control path for controlling the actual sample rate conversion. The control path includes the interpolator and the filter coefficient memory.

As shown in FIG. 4, samples of an audio data stream are received and stored in an input FIFO 405. The input data stream has a sample rate of $F_{in}$. The samples are read from FIFO 405 and convolved with a set of interpolated coefficients by convolution engine 410. Convolution engine 410 effectively up-samples or down-samples the data to produce samples at a rate equivalent to the output rate ($F_{out}$) of the sample rate converter. These samples are stored in an output FIFO 406. The samples are then read out of output FIFO 406 at rate $F_{out}$.

Frame sync signals associated with the audio data are received by rate estimator counters 421 and 422. Rate estimator counters 421 and 422 simply count the numbers of clock cycles between samples received on the respective channels. (It should be noted that, while the present embodiment has two channels, and corresponding rate estimators, other embodiments may handle N channels and have N corresponding sets of components.) One of the rate estimator counters is selected by multiplexer 430 and the corresponding count is filtered by low pass filter 440. The filtered sample rate count is forwarded to phase selection unit 450, and is used to interpolate the filter coefficients for the polyphase filter. The interpolated polyphase filter coefficients are then convolved with the data samples in convolution unit 410 to produce the re-sampled data.

Figure 5:
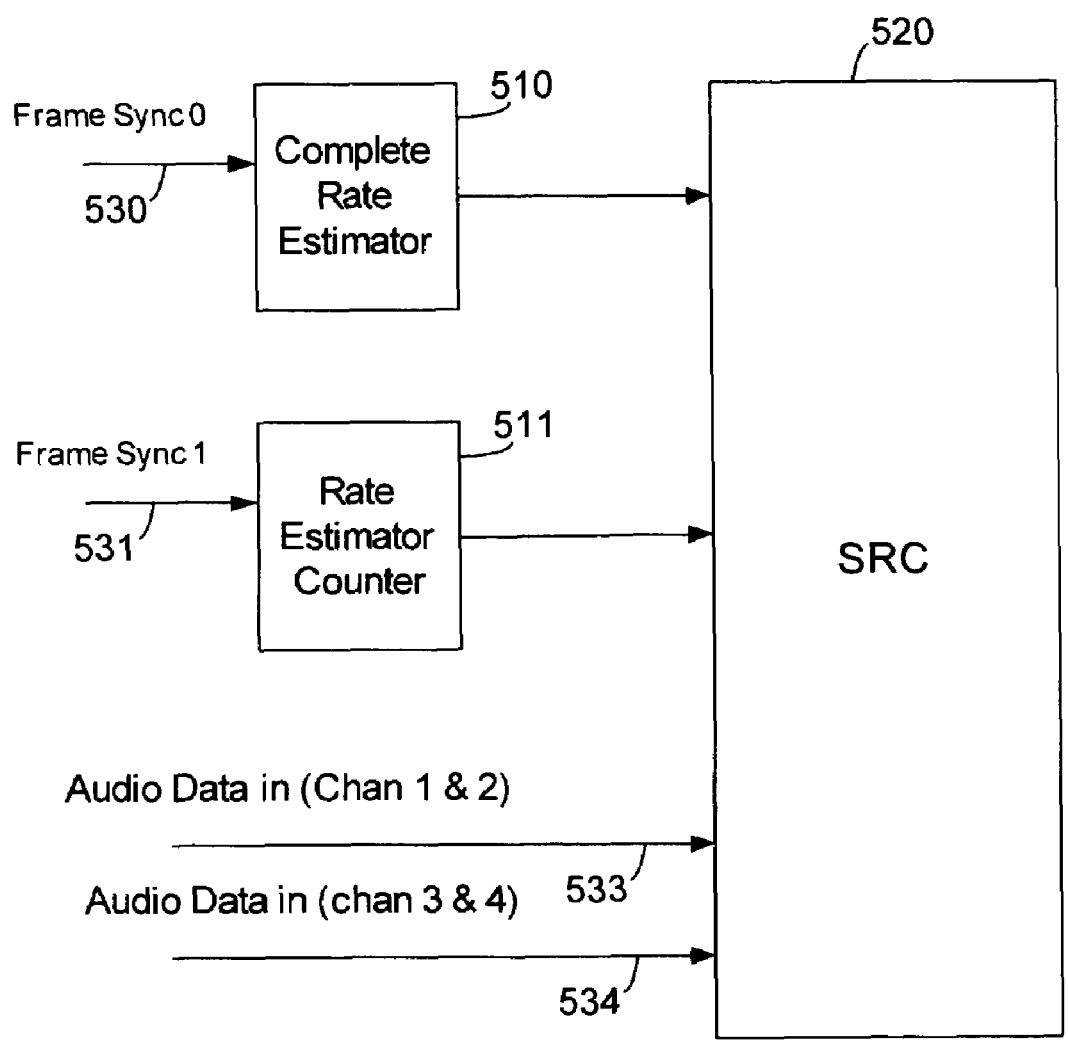
FIG. 5 is a diagram illustrating the use of dual input rate estimator counters in accordance with one embodiment.

Referring to FIG. 5, a more simplified view of the dual rate estimator counters in this embodiment is shown. In this figure, rate estimator counters 510 and 511 are the only components of sample rate converter 520 that are shown separately from the sample rate converter. This should not be construed to mean that the remainder of the sample rate converter components are implemented in hardware or in a single component.

In FIG. 5, rate estimator counter 510 receives a frame sync signal for a first data stream on line 530. Rate estimator counter 511 receives a frame sync signal for a second data stream on line 531. Each of the rate estimator counters maintains a count of the clock cycles that are detected between receipt of the corresponding frame sync signal and receipt of a subsequent frame sync signal on the respective line. In other words, the counters are incremented for each clock signal between a first frame sync and a second frame sync on the corresponding one of lines 530 and 531. This is repeated for the second and third frame sync signals and each consecutive pair of frame sync signals. The values stored in the counters can be accessed as necessary by sample rate converter 520 to determine the number of cycles that are detected between frame sync signals. In one embodiment, both rate estimate counters are clocked by the same high speed system clock.

The manner in which sample rate converter 520 utilizes the rate estimate counters may vary from one embodiment to another. For instance, in one embodiment, sample rate converter 520 may reset the rate estimate counters at regular intervals. in another embodiment, sample rate converter 520 may maintain a rolling count over the required interval. Sample rate converter 520 may also low-pass filter the count in order to reduce jitter in the computed sample rate.

The audio data to which these frame sync signals correspond is received on separate lines. More specifically, the audio data stream corresponding to frame sync signal 0 on line 530 is received by the sample rate converter on line 533.

This data stream includes audio data for two channels (channels 1 and 2), as the data is typically handled in stereo pairs. The audio data stream for channels 3 and 4 (corresponding to frame sync signal 1 on line 531) is received by the sample rate converter on line 533. The audio data received on each of line 533 and 534 is stored in separate buffers (one for each data stream). In one embodiment, these buffers are FIFOs. As the sample rate for each of the data streams is computed, the appropriate conversion (to achieve the desired output sample rate) is determined. The data is then removed from the buffers and converted to the output sample rate.

In one embodiment, the output of one counter is used for rate estimation of a primary data stream. The second rate estimate counter is then read by the sample rate converter, and the value is compared to the value read from the first rate estimate counter value to determine the ratio between them. This ratio corresponds to the ratio between the sample rates of the two data streams. The ratio is typically an integer multiple. The sample rate converter may be configured to adapt the computed sample rates for the two data streams so that one rate is an integer multiple of the other. The sample rate converter then converts the primary data stream according to the sample rate determined from the value in the first rate estimate counter and converts the secondary data stream according to the sample rate determined from the ratio of the counter values.

Referring again to FIG. 4, the flow of data samples through FIFO 405 and FIFO 406 are managed by FIFO management unit 407. Based on the flow of data, FIFO management unit 407 provides feedback to feedback unit 470. This feedback is used to adjust low pass filter 440. Effectively, this adjusts the sample rate which is estimated and thereby adjusts the coefficient interpolation performed in the sample rate converter. The sample rate conversion is thereby also adjusted to more closely track the actual input sample rate and to prevent the overflow or underflow of FIFOs 405 and 406.

In one embodiment, rate estimator counters 421 and 422 are 24-bit counters. Each can select from four input frame sync signals: SAI LRCK; SPDIF RX frame sync; Packet Data frame sync; and ESSI frame sync. The period measurement is accomplished by counting the number of DSP clock cycles within the counting period of the frame sync signal. The counting period is programmable, typically with the period equal to 1. In this embodiment, the count is multiplied by a gain. The gain is a 12-bit integer which is typically set to a power of 2, which is equivalent to a 1-bit left shift which creates an additional bit of resolution.

Low pass filter 440 is, in one embodiment, a second-order IIR filter. This filter may, for example, comprise a pair of cascaded first-order IIR filters. Low pass filter 440 attenuates jitter in the count received from the rate estimator counter. This ensures that the count changes slowly, and thereby improves the quality of the sample rate conversion. The averaging process that is implemented by the low pass filter causes the potential for buffer underflow or overflow. This problem is corrected by implementing closed loop feedback in the software which adjusts a 24-bit offset that is added to the count value before the value is passed through low pass filter 440. In one embodiment, the filter coefficient of low pass filter 440 is adjustable to allow faster frequency and phase lock.

Coefficient interpolator 460 works in conjunction with the ROM in which the coefficients are stored and the ROM address generator that provides addresses for retrieval of the coefficients for use by the interpolator. The filter coefficients are actually stored in two ROMs—one stores even coefficients, while the other stores odd coefficients. The interpolator performs a cubic spline interpolation. The interpolator employs a five-stage, two-cycle pipeline to perform the interpolation, thereby enabling resource sharing while maintaining a throughput of one interpolation per two clock cycles.

In one embodiment, the software of the sample rate converter is responsible for performing a number of tasks. For example, as mentioned above, rate estimator counters 421 and 422 multiply their respective counter values by a gain, but the gain is determined by the software. Similarly, the offset and filter coefficients for the low pass filter following the rate estimator counters are determined by the software. The software is further responsible for calculating the ratio of the input sample rate ($F_{in}$) to the output sample rate ($F_{out}$). Based upon the ratio of sample rates and the filtered counter values, the software determines the filter length, phase and phase increment for interpolation of the polyphase filter coefficients. Further, the software is responsible for convolving the polyphase filter coefficients with the input samples, managing the input and output FIFOs, and providing feedback for adjustment of the estimated input sample rate.

The software components are implemented in a data processor. Typical modern processors have the capability of executing tight loops very efficiently while reading in data streams. For example, digital signal processors (DSP's) have "zero overhead looping" capability. Modern microcontrollers also have the capability of executing multiple instructions per cycle. These DSP's and microcontrollers typically also have separate program and data memories that make them suitable for sample rate converter applications.

These processors have the capability, for example, to execute the following in one processor cycle: read a data sample from memory (as indicated by a sample pointer register); update the sample pointer register to point to a next sample; multiply the data sample by a coefficient value; and add (accumulate) the result of the multiplication in a data register. If the polyphase filter contains X coefficients, X clock cycles are used to compute one output sample.

Aside from the functions mentioned above, the sample rate converter is responsible for reading and interpolating the polyphase filter coefficients. A processor can handle a number of parallel channels Y at the same time, where Y is limited by the available number of accumulator and sample pointer registers. When Y channels are processed simultaneously using identical coefficients, relatively compact hardware can be designed to perform the following in Y or less cycles: read a number of coefficients from memory (as indicated by coefficient pointer); update a coefficient pointer register; and perform interpolation to calculate filter coefficients to a desired precision.

In "pseudo C" the processor would do the following:

for every output sample
    Initialize the hardware coefficient calculator

```
for j=1 to Y
    o[Y]=0;                 //Initialize accumulators
    p[Y]=start(N);          //Initialize pointers
for i=1 to X                // For every coefficient
    C = mem[coeff]          // Read coefficient
    for j=1 to Y            // For every channel
        o[Y] += C*mem[p[Y]++]
```

Typically, the inner loop using j would be unrolled, and reading the next coefficient would be done in parallel with the last iteration (j=Y). A simple and efficient processor would calculate a new coefficient for every Y cycles. A more flexible solution would calculate a coefficient in Y or fewer cycles. When a new sample becomes available, it will halt computations until this sample is read and thereby automatically adjust to the rate at which the DSP reads the filter coefficients. Besides making the actual value of Y more flexible, this also allows the processor to periodically halt the computations and service other functions like interrupts.

In some embodiments, components of the sample rate converter may be shared between two or more independent sample rate conversion paths. For instance, two different paths may both use the same interpolator hardware.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention.

What is claimed is:

1. A system comprising:
   a clock source;
   a first counter coupled to receive a clock signal from the clock source and configured to count cycles of the clock signal in a sample period corresponding to a first digital data stream;
   a second counter coupled to receive the clock signal from the clock source and configured to count cycles of the clock signal in a sample period corresponding to a second digital data stream; and
   a data processor coupled to the first and second counters and configured to
      read a first number of cycles counted by the first counter and a second number of cycles counted by the second counter, and
      convert at least one of the first and second digital data streams from a corresponding input sample rate to a predetermined sample rate based on the number of cycles counted in the corresponding digital data stream,
   wherein the first counter is configured to count cycles corresponding to the first digital data stream by incrementing once for each cycle after a frame sync signal is received in the first digital data stream and wherein the second counter is configured to count cycles corresponding to the second digital data stream by incrementing once for each cycle after a frame sync signal is received in the second digital data stream.

2. The system of claim 1, wherein the data processor is configured to convert the first input digital data stream from the first input sample rate to the predetermined output sample rate in a first channel, wherein the data processor is configured to convert the second input digital data stream from the second input sample rate to the predetermined output sample rate in a second channel, and wherein at least a portion of a plurality of processing components of the first and second channels are common to both the first and second channels.

3. A method comprising:
   receiving a clock signal from a clock source;
   receiving a first digital data stream;
   receiving a second digital data stream;
   counting a first number of cycles of the clock signal in a sample period corresponding to a first digital data stream and a second number of cycles of the clock signal in a sample period corresponding to a second digital data stream, wherein counting the first number of cycles for the first digital data stream comprises incrementing a first counter once for each cycle after a frame sync signal is received in the first digital data stream and counting the second number of cycles for the second digital data stream comprises incrementing a second counter once for each cycle after a frame sync signal is received in the second digital data stream; and
   converting at least one of the first and second digital data streams from a corresponding input sample rate to a predetermined sample rate based on the number of cycles counted for the corresponding digital data stream.

4. The method of claim 3, wherein counting the first number of cycles for the first digital data stream further comprises reading a first value from the first counter and wherein counting the second number of cycles for the second digital data stream further comprises reading a second value from the second counter.

5. A system comprising:
   a sample rate converter configured to receive a first input digital data stream and a second input digital data stream and to convert each of the first and second input digital data streams from corresponding input sample rates to a predetermined output sample rate;
   wherein the sample rate converter includes
      a clock source,
      a first counter coupled to receive a clock signal from the clock source and configured to count cycles of the clock signal in a sample period of the first input digital data stream,
      a second counter coupled to receive the clock signal from the clock source and configured to count cycles of the clock signal in a sample period of the second input digital data stream, and
      a data processor coupled to the first and second counters and configured to
         read a first number of cycles counted by the first counter and a second number of cycles counted by the second counter,
         estimate a first input sample rate of the first input digital data stream,
         calculate a second input sample rate of the second input digital data stream by multiplying the first input sample rate by the ratio of the second number of cycles to the first number of cycles, and
         convert each of the first and second input digital data streams from the corresponding input sample rates to the predetermined output sample rate.

6. The system of claim 5, wherein the first and second input sample rates are not restricted to a set of predetermined sample rates.

7. The system of claim 6, wherein the first and second input sample rates are different.

8. The system of claim 5, further comprising one or more low-pass filters configured to filter the first number of cycles and the second number of cycles.

9. The system of claim 5, wherein the data processor is configured to reset the first and second counters each time a succeeding frame sync signal is received.

10. The system of claim 5, further comprising a first FIFO and a second FIFO, wherein data from the first digital data stream is stored in the first FIFO and data from the second digital data stream is stored in the second FIFO.

11. The system of claim 5, wherein the sample rate converter is implemented in a pulse-width modulated digital audio amplifier.

12. A method comprising:
   receiving a clock signal from a clock source;
   receiving a first input digital data stream;
   receiving a second input digital data stream;
   counting a first number of cycles of the clock signal in a sample period of the first input digital data stream and a second number of cycles of the clock signal in a sample period of the second input digital data stream;
   estimating a first input sample rate of the first input digital data stream;
   calculating a second input sample rate of the second input digital data stream by multiplying the first input sample rate by the ratio of the second number of cycles to the first number of cycles, and
   converting each of the first and second input digital data streams from the corresponding input sample rates to a predetermined output sample rate.

13. The method of claim 12, further comprising resetting the first and second counters each time a succeeding frame sync signal is received.

14. The method of claim 12, further comprising storing data from the first input digital data stream in a first FIFO and storing data from the second input digital data stream in a second FIFO.

15. The method of claim 12, further comprising low-pass filtering the first number of cycles and the second number of cycles.

16. The method of claim 12, wherein the first and second input sample rates are not restricted to a set of predetermined sample rates.

17. The method of claim 12, wherein the first and second input sample rates are different.

18. The method of claim 12, wherein the method is implemented in a pulse-width modulated digital audio amplifier.

* * * * *